US011518909B2

(12) United States Patent
Noh et al.

(10) Patent No.: US 11,518,909 B2
(45) Date of Patent: Dec. 6, 2022

(54) COMPOSITION FOR FORMING SILICA LAYER, MANUFACTURING METHOD FOR SILICA LAYER, AND SILICA LAYER

(71) Applicant: Samsung SDI Co., Ltd., Yongin-si (KR)

(72) Inventors: Kunbae Noh, Suwon-si (KR); Taeksoo Kwak, Suwon-si (KR); Junyoung Jang, Suwon-si (KR); Yoonyoung Koo, Suwon-si (KR); Yonggoog Kim, Suwon-si (KR); Jingyo Kim, Suwon-si (KR); Jin-Hee Bae, Suwon-si (KR); Jun Sakong, Suwon-si (KR); Jinwoo Seo, Suwon-si (KR); Sooyeon Sim, Suwon-si (KR); Huichan Yun, Suwon-si (KR); Jiho Lee, Suwon-si (KR); Kwen-Woo Han, Suwon-si (KR); Byeong Gyu Hwang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 16/645,343

(22) PCT Filed: Feb. 13, 2018

(86) PCT No.: PCT/KR2018/001880
§ 371 (c)(1),
(2) Date: Mar. 6, 2020

(87) PCT Pub. No.: WO2019/074167
PCT Pub. Date: Apr. 18, 2019

(65) Prior Publication Data
US 2020/0369915 A1    Nov. 26, 2020

(30) Foreign Application Priority Data
Oct. 13, 2017 (KR) .......................... 10-2017-0133531

(51) Int. Cl.
*C09D 183/16* (2006.01)
*H01L 21/02* (2006.01)
*H01L 21/306* (2006.01)

(52) U.S. Cl.
CPC ...... *C09D 183/16* (2013.01); *H01L 21/02123* (2013.01); *H01L 21/30604* (2013.01)

(58) Field of Classification Search
None
See application file for complete search history.

(56) References Cited

U.S. PATENT DOCUMENTS

| 5,885,654 A | 3/1999 | Hagiwara et al. |
| 9,748,175 B1 | 8/2017 | Liu et al. |

(Continued)

FOREIGN PATENT DOCUMENTS

| CN | 100444331 C | 12/2008 |
| CN | 101506941 A | 8/2009 |

(Continued)

OTHER PUBLICATIONS

International Search Report (PCT/ISA/210) dated Nov. 19, 2018, issued by the International Searching Authority in counterpart International Application No. PCT/KR2018/001880.

(Continued)

*Primary Examiner* — Alexander G Ghyka
(74) *Attorney, Agent, or Firm* — Sughrue Mion, PLLC

(57) ABSTRACT

Provided is a composition for forming a silica layer, the composition containing a silicon-containing polymer and a solvent, wherein a silica layer formed of the composition for forming the silica layer satisfies Relation 1. The definition of Relation 1 is as described in the specification. The definition of Relation 1 is the same as described in the specification.

12 Claims, 2 Drawing Sheets

(56) References Cited

U.S. PATENT DOCUMENTS

| | | | |
|---|---|---|---|
| 2005/0089489 A1* | 4/2005 | Carter | C11D 7/08 424/70.1 |
| 2011/0129981 A1* | 6/2011 | Lim | H01L 21/02216 438/381 |
| 2013/0043563 A1* | 2/2013 | Nakazawa | H01L 29/66795 438/514 |
| 2015/0337168 A1 | 11/2015 | Bae et al. | |
| 2017/0154771 A1* | 6/2017 | Warren | H01L 21/02546 |
| 2019/0189430 A1* | 6/2019 | Bae | C01B 21/068 |
| 2021/0053832 A1* | 2/2021 | Bae | H01L 27/1248 |

FOREIGN PATENT DOCUMENTS

| | | |
|---|---|---|
| CN | 102569060 A | 7/2012 |
| CN | 105315679 A | 2/2016 |
| CN | 105713512 A | 6/2016 |
| CN | 106232687 A | 12/2016 |
| EP | 0544959 A1 | 6/1993 |
| EP | 0 544 959 B1 | 7/1998 |
| EP | 1 427 004 A2 | 6/2004 |
| EP | 2 264 744 A1 | 12/2010 |
| JP | 5-74963 A | 3/1993 |
| JP | 8-64679 A | 3/1996 |
| JP | 2001-308090 A | 11/2001 |
| JP | 2007-88369 A | 4/2007 |
| JP | 2011-114163 A | 6/2011 |
| JP | 2012-39115 A | 2/2012 |
| JP | 2012-134302 A | 7/2012 |
| JP | 2014-509081 A | 4/2014 |
| JP | 2015-33764 A | 2/2015 |
| JP | 6571403 B2 | 9/2019 |
| JP | 6599640 B2 | 10/2019 |
| KR | 10-1998-0018634 A | 6/1998 |
| KR | 10-2001-0100749 A | 11/2001 |
| KR | 10-2015-0135976 A | 12/2015 |
| KR | 10-2016-0041728 A | 4/2016 |
| KR | 10-2017-0014947 A | 2/2017 |
| WO | 2008/029834 A1 | 3/2008 |

OTHER PUBLICATIONS

Written Opinion (PCT/ISA/237) dated Nov. 19, 2018, issued by the International Searching Authority in counterpart International Application No. PCT/KR2018/001880.

Communication dated Apr. 6, 2021, issued by the State Intellectual Property Office of P R. China in counterpart Chinese Application No. 201880066432.9.

Communication dated Jun. 1, 2021, issued by the Japan Patent Office in counterpart Japanese Patent Application No. 2020-519446.

* cited by examiner

[FIG. 1]
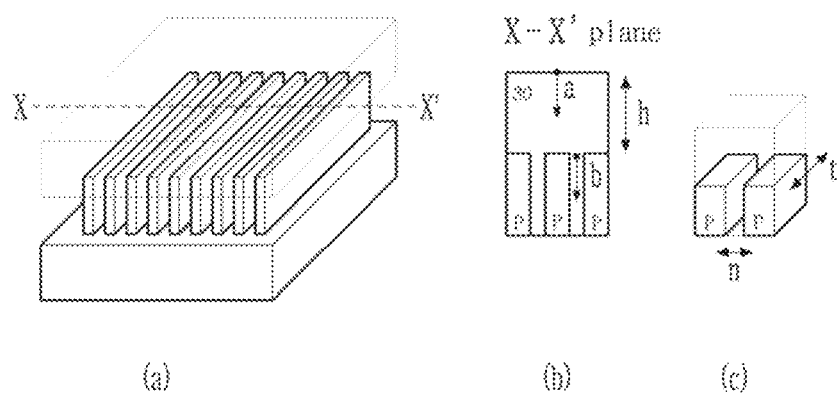
(a)  (b)  (c)
[FIG. 2]
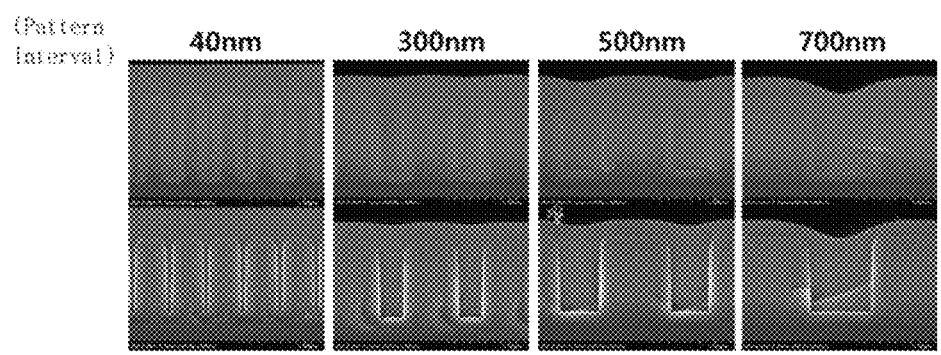

[FIG. 3]
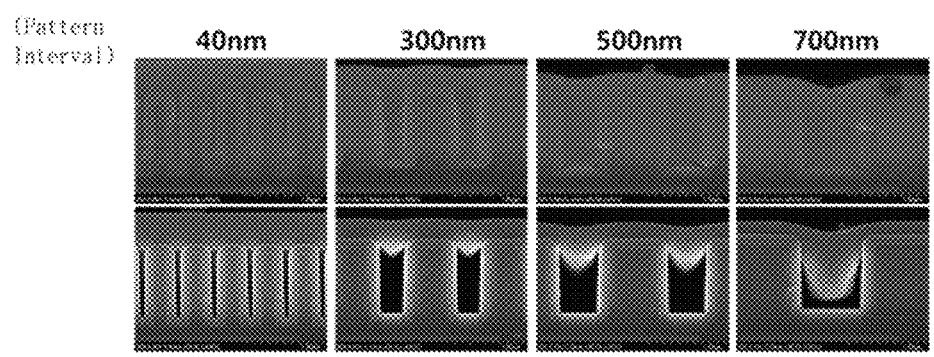
[FIG. 4]
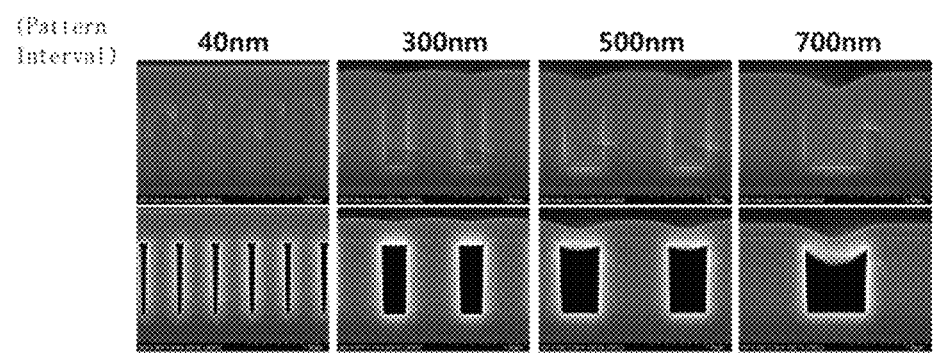

COMPOSITION FOR FORMING SILICA LAYER, MANUFACTURING METHOD FOR SILICA LAYER, AND SILICA LAYER

CROSS-REFERENCE TO RELATED APPLICATION

This application claims priority to and the benefit of Korean Patent Application No. 10-2017-0133531 filed in the Korean Intellectual Property Office on Oct. 13, 2017, the entire contents of which are incorporated herein by reference.

BACKGROUND OF THE INVENTION

(a) Field of the Invention

This disclosure relates to a composition for forming a silica layer, a method of manufacturing a silica layer, and a silica layer manufactured therefrom.

(b) Description of the Related Art

In a flat panel display device, a thin film transistor (TFT) including a gate electrode, a source electrode, a drain electrode, and a semiconductor is used as a switching element. The flat panel display device includes a gate line for transmitting a scan signal for controlling the thin film transistor and a data line for transmitting a signal to be applied to a pixel electrode. In addition, an insulation layer for separating them is formed between the semiconductor and various electrodes. The insulation layer may be silica layers including a silicon component.

In general, there are many studies on a composition for forming a silica layer which is manufactured by forming a coating film using polysilazane, polysiloxane, or a mixture thereof on a patterned substrate and then converting it into an oxide film and which may exhibit improved mechanical and chemical strength inside the pattern.

SUMMARY OF THE INVENTION

According to the present invention, in a silica layer covering an inside of a pattern and an upper portion of a pattern, etching rates inside the pattern and the upper portion of the pattern satisfy a predetermined relation so that the silica layer inside the pattern may be selectively removed in a subsequent process. Such a silica layer may be utilized for various applications in semiconductor and display processes.

An embodiment of the present invention provides a composition for forming a silica layer in which the etching rate inside the pattern and the etching rate on the upper portion of the pattern may satisfy a predetermined relation.

Another embodiment of the present invention provides a silica layer including a silica component formed by curing the composition for forming the silica layer.

Another embodiment of the present invention provides an electronic device including the silica layer.

According to an embodiment, a composition for forming a silica layer includes a silicon-containing polymer and a solvent, wherein a silica layer formed from the composition for forming the silica layer satisfies Relation 1.

$$\frac{b}{a} > \frac{(t/2)}{h} \quad \text{[Relation 1]}$$

In Relation 1,
a is an etch rate on the upper portion of the pattern,
b is an etch rate inside the pattern,
h is a layer thickness on the upper portion of the pattern,
t is a pattern length, and
n is a pattern interval:
in Relation 1, 'pattern' refers to a pattern formed on the substrate on which the composition for forming the silica layer is coated.

The silicon-containing polymer may be an organic-inorganic polysilazane, an organic-inorganic polysiloxazane, or a combination thereof.

In Relation 1, a and b may be etch rates obtained by a wet etch method.

The silica layer formed from the composition for forming the silica layer may satisfy Relation 2.

$$\frac{b}{a} > 3 \quad \text{[Relation 2]}$$

In Relation 2,
a and b are the same as defined in Relation 1.

The silicon-containing polymer may include at least one of a moiety represented by Chemical Formula 1 and a moiety represented by Chemical Formula 2.

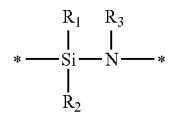

[Chemical Formula 1]

In Chemical Formula 1,
$R_1$ to $R_3$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and "*" refers to a linking point.

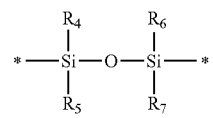

[Chemical Formula 2]

In Chemical Formula 2,
$R_4$ to $R_7$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and "*" refers to a linking point.

The silicon-containing polymer may be included in an amount of 0.1 to 30 wt % based on a total amount of the composition for forming the silica layer.

According to another embodiment, a silica layer including a silica component obtained by curing the aforementioned composition for forming the silica layer is provided.

According to another embodiment, an electronic device including the aforementioned silica layer is provided.

In the composition for forming the silica layer according to an embodiment, the etching rate inside the pattern and the etching rate on the upper portion of the pattern may satisfy a predetermined relation, thereby selectively removing the silica layer formed inside the pattern of the substrate in a subsequent process and thus, an air gap may be formed inside the pattern of the substrate.

BRIEF DESCRIPTION OF THE DRAWINGS

FIG. 1 is a reference diagram for Relation 1,

FIG. 2 is a scanning micrograph of a cross section of the silica layer according to Comparative Example 1, FIG. 3 is a scanning microscope photograph of a cross section of the silica layer according to Example 1, and FIG. 4 is a scanning microscope photograph of a cross section of the silica layer according to Example 2.

DETAILED DESCRIPTION OF THE EMBODIMENTS

Embodiments of the present invention will be described in detail so that those skilled in the art to which the present invention pertains may easily practice. However, this invention may be embodied in many different forms and is not construed as limited to the example embodiments set forth herein.

In the present specification, when a definition is not otherwise provided, 'substituted' refers to replacement of hydrogen of a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 heterocycloalkyl group, and a combination thereof.

In addition, in the present specification, when a definition is not otherwise provided, 'hetero' refers to one including 1 to 3 heteroatoms selected from N, O, S, and P.

In addition, as used herein, '*' means a portion linked with the same or different atoms or chemical formulae.

Hereinafter, a composition for forming a silica layer according to an embodiment of the present invention is described.

The composition for forming the silica layer according to an embodiment includes a silicon-containing polymer and a solvent, and the silica layer formed from the composition for forming the silica layer satisfies Relation 1.

$$\frac{b}{a} > \frac{(t/2)}{h}$$ [Relation 1]

In Relation 1, a is an etch rate on the upper portion of the pattern, b is an etch rate inside the pattern, h is a layer thickness on the upper portion of the pattern, t is a pattern length, and n is a pattern interval:

in Relation 1, 'pattern' refers to a pattern formed on the substrate on which the composition for forming the silica layer is coated.

The Relation 1 will be described with reference to FIG. 1.

FIG. 1 is a reference diagram for Relation 1.

FIG. 1(a) illustrates a process in which the composition for forming silica layer is coated on the substrate 10 on which a pattern (P) is formed, to form a silica layer.

The cross section of the laminate shown in FIG. 1(a) taken along X-X' plane is shown in FIG. 1(b). Referring to FIG. 1(b), a silica layer 30 is formed by filling a composition for forming a silica layer 30 between the pattern (P) and the pattern (P) and on the upper portion of the pattern (P). The silica layer 30 is formed by curing the composition for forming the silica layer, and may be, for example, cured into a silica layer by heat treatment, and the heat treatment temperature or time is not particularly limited. For example, the heat treatment temperature may be, for example, about 300° C. to about 1,000° C., but is not limited thereto.

In FIG. 1(b), an etch rate of the silica layer 30 on the pattern (P) and an etch rate of the silica layer 30 inside the pattern (P) are respectively expressed as a and b in Relation 1. As far as the etch rates a and b are calculated under the same etch condition, the etch condition is not specifically limited. For example, the etch rates a and b may be obtained through dry etching or wet etching. For example, the etching may be performed by using a wet etchant, for example, a wet etchant including a fluorine element, but is not limited thereto.

In FIGS. 1 (b) and (c), h denotes the thickness of the silica layer measured on the upper portion of the pattern, t denotes pattern (P) length, and n denotes an interval between the pattern (P) and the pattern (P). In the substrate, a plurality of patterns are formed in the same shape and interval.

In FIG. 1, the pattern (P) is shown to have a hexahedral shape but is not limited thereto, and as far as a plurality of patterns is formed to have the same shape and the same interval, the shape of each pattern is not specifically limited.

For example, when the pattern has a shape of line/space, the silica layer on the pattern and inside the pattern may be isotopically etched. Herein the 'isotopically etched' means that the etching is performed all together on three surfaces of a front surface, a rear surface, and an upper surface on the pattern and inside the pattern.

The composition for forming the silica layer according to an embodiment may form an air gap in the silica layer covering the inside of the pattern of the substrate by satisfying Relation 1. Accordingly, the silica layer inside the pattern may be selectively removed in the subsequent process. This silica layer may be variously applied in semiconductor and display processes. For example, when used as a fine insulation layer required for a STI (shallow trench isolation) layer of a semiconductor, in order to prevent a leakage current between the patterns, air gaps between the patterns may be formed. In addition, the silica layer may be used to form various nano structures having periodical repetitive patterns. For example, after forming the air gaps by internally etching the pattern, a chemical vacuum deposition method or an atomic layer vacuum deposition method may be used to fill them with a third material differing from the inside of the pattern and the pattern substrate.

For example, the etch rates a and b may satisfy Relation 2.

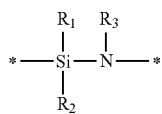
[Relation 2]

In Relation 2, a and b are the same as defined in Relation 1.

Herein, the upper surface of the pattern may be prevented from being exposed while the inside of the pattern is etched, and as for a thinner film, inside of the pattern may be completely etched, and accordingly, a process for desired patterns may be performed within a wider range and thus easily adjusted. On the other hand, when a and b do not satisfy Relation 2, the etching may be excessively performed to remove the silica layer inside the pattern and thus expose the upper portion of the pattern and the like, which may not ease the process adjustment.

The silicon-containing polymer included in the composition for forming the silica layer may be, for example, organic-inorganic polysilazane, organic-inorganic polysiloxazane, or a combination thereof. Herein, 'organic-inorganic' refers to an inorganic substance substituted with an organic group, and for example, the organic-inorganic polysilazane refers to polysilazane substituted with an organic group.

The silicon-containing polymer may include, for example, a moiety represented by Chemical Formula 1.

[Chemical Formula 1]

In Chemical Formula 1, $R_1$ to $R_3$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and "*" refers to a linking point.

For example, the silicon-containing polymer may be polysilazane produced by a reaction of halosilane and ammonia.

For example, the silicon-containing polymer included in the composition for forming the silica layer may include a moiety represented by Chemical Formula 2.

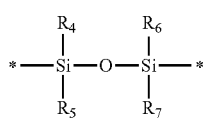
[Chemical Formula 2]

$R_4$ to $R_7$ of Chemical Formula 2 are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and "*" refers to a linking point.

For example, the silicon-containing polymer may include a moiety represented by Chemical Formula 1 and/or a moiety represented by Chemical Formula 2, and further include a moiety represented by Chemical Formula 3.

$$*\!-\!SiH_3 \qquad \text{[Chemical Formula 3]}$$

The moiety represented by Chemical Formula 3 is a structure where the terminal end is capped with hydrogen, and may be included in an amount of 15 to 35 wt % based on a total amount of the Si—H bond of the polysilazane or polysiloxazane structure. When the moiety of Chemical Formula 3 is included in the polysilazane or polysiloxazane structure within the range, a $SiH_3$ moiety is prevented from being scattered into $SiH_4$ while an oxidation reaction sufficiently occurs during the heat treatment, and a crack in a filler pattern may be prevented.

For example, the silicon-containing polymer may be included in an amount of 0.1 wt % to 30 wt % based on the composition for forming the silica layer.

The solvent included in the composition for forming the silica layer is not particularly limited as long as it is a solvent capable of dissolving the silicon-containing polymer, and may include specifically at least one selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, and a combination thereof.

On the other hand, the composition for forming the silica layer may further include a thermal acid generator (TAG).

The thermal acid generator may be an additive to improve developing a property of the composition for forming the silica layer, and thus makes the polymer of the composition be developed at a relatively low temperature.

The thermal acid generator may include any compound without particular limit, if it generates acid ($H^+$) by heat. In particular, it may include a compound activated at 90° C. or higher and generating sufficient acid and also, having low volatility.

The thermal acid generator may be, for example selected from nitrobenzyl tosylate, nitrobenzyl benzenesulfonate, phenol sulfonate, and a combination thereof.

The thermal acid generator may be included in an amount of 0.01 wt % to 25 wt % based on a total amount of the composition for forming the silica layer and within the range, the polymer may be developed at a low temperature and simultaneously, have improved coating properties.

The composition for forming the silica layer may further include a surfactant.

The surfactant is not particularly limited and may be, for example, a non-ionic surfactant of polyoxyethylene alkyl ethers such as polyoxyethylene lauryl ether, polyoxyethylene stearyl ether, polyoxyethylene cetyl ether, polyoxyethylene oleyl ether, and the like, polyoxyethylene alkylallyl ethers such as polyoxyethylenenonyl phenol ether, and the like, polyoxyethylene.polyoxypropylene block copolymers, polyoxyethylene sorbitan fatty acid ester such as sorbitan monolaurate, sorbitan monopalmitate, sorbitan monostearate, sorbitan monoleate, polyoxyethylene sorbitan monostearate, polyoxyethylene sorbitan trioleate, polyoxyethylene sorbitan tristearate, and the like; a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and the like; other silicone-based surfactants such as an organosiloxane polymer KP341 (Shin-Etsu Chemical Co., Ltd.), and the like.

The surfactant may be included in an amount of 0.001 wt % to 10 wt % based on a total amount of the composition for forming the silica layer and within the range, dispersion of a solution and simultaneously, uniform thickness of the layer may be improved.

According to another embodiment, a method of manufacturing a silica layer may include coating the aforementioned composition for forming the silica layer, drying a substrate coated with the composition for forming the silica layer, and curing the composition for forming the silica layer.

For example, the composition for forming the silica layer may be coated using a solution process such as a spin-on coating, a slit coating, an inkjet printing.

The substrate may be, for example a device substrate such as a semiconductor, a liquid crystal, and the like, but is not limited thereto.

When the coating of the composition for forming the silica layer is completed, the substrate is then dried and cured. The drying and curing may be performed at a temperature of greater than or equal to about 100° C., for example, and may be performed by applying energy such as heat, ultraviolet light, microwaves, sound waves, or ultrasonic waves.

For example, the drying may be performed at about 100° C. to about 200° C., and the solvent in the composition for forming the silica layer may be removed through the drying. In addition, the curing may be performed at about 250° C. to 1,000° C., and the composition for forming the silica layer may be converted into a thin oxide film through the curing. The curing may include, for example, first curing in an aqueous vapor atmosphere of 250° C. to 1,000° C. and second curing in a nitrogen atmosphere of 600° C. to 1,000° C.

According to another embodiment of the present invention, a silica layer including a silica component obtained by curing the aforementioned composition for forming the silica layer is provided.

The silica layer may be, for example, an insulation layer, a separation layer, a hard coating layer, and the like, but is not limited thereto.

An electronic device including the silica layer of the present invention is provided. The electronic device may be, for example a display device such as LCD or LED, or semiconductor device.

The following examples illustrate embodiments of the present invention in more detail. However, these examples are exemplary, and the present disclosure is not limited thereto.

Preparation of Composition for Forming Silica Layer

Comparative Example 1

Dry nitrogen was substituted inside a 2 L reactor equipped with a stirrer and a temperature controller. Then, 1,500 g of dry pyridine was put in the reactor, and the reactor was maintained at 0° C. Subsequently, 100 g of dichlorosilane was slowly injected thereinto over one hour. Then, 70 g of ammonia was slowly injected thereinto over 3 hours, while the mixture was stirred. Then, dry nitrogen was injected thereinto for 30 minutes, and the ammonia remaining in the reactor was removed. The obtained white slurry product was filtered through a 1 μm Teflon filter under a dry nitrogen atmosphere, obtaining 1,000 g of a filtered solution. Then, 1,000 g of dry xylene was added thereto, and the mixture was adjusted to have a solid content of 30 wt % by three times repetitively substituting pyridine for the xylene by using a rotary evaporator and then, filtered with a Teflon filter having a pore size of 0.03 μm. Then, 300 g of dry pyridine was added to the filtered solution, and the mixture was heated at 100° C. until its weight average molecular weight reached 5,000. Then, 1,000 g of dry dibutylether was added thereto, and the mixture was adjusted to have a solid content of 20 wt % by three times repetitively substituting dibutylether for the solvent by using a rotary evaporator, obtaining a hydrogenated polysiloxazane solution. Through the above procedure, a hydrogenated polysiloxazane having a weight average molecular weight of 3,000 was obtained.

Example 1

The hydrogenated polysiloxazane solution according to Comparative Example 1 was put in a 100° C. reactor and then, stirred, while 2 wt % HMDS was slowly injected thereinto, to obtain organic-inorganic polysiloxazane having a weight average molecular weight of 3,500.

Example 2

The hydrogenated polysiloxazane solution according to Comparative Example 1 was put in a 100° C. reactor and then, stirred, while 10 wt % HMDS was slowly injected thereinto, to obtain organic-inorganic polysiloxazane having a weight average molecular weight of 5,000.

Formation of Silica Layers

A silicon wafer repetitively patterned to have a line width of 40 nm was prepared.

On the wafer, the compositions for forming the silica layer according to Comparative Example 1 and Examples 1 and 2 were respectively coated and prebaked at 150° C. for 2 minutes. Subsequently, the wafers coated with the compositions were cured at 600° C. for 60 minutes in a furnace including aqueous vapors to form silica-based layers.

Wafers repetitively patterned to respectively have each line width of 300 nm, 500 nm, and 700 nm were respectively used instead of the silicon wafer patterned to have a line width of 40 nm to form silica layers.

Evaluation

Specimens of the silica layers were cut to secure cross sections exposing fine patterns and then, dipped for several minutes in an aqueous solution including an F element and completely washed with DI water. Subsequently, the specimens were completely dried with $N_2$, and the cross sections thereof were examined with a scanning electron microscope (FE-SEM).

The results are shown in Table 1.

TABLE 1

| | Etch rate (a) on the upper portion of the pattern | Etch rate (b) inside the pattern | Silica layer thickness (h) on the upper portion of the pattern | Pattern length (t) | Pattern interval (n) | b/a | Satisfaction of Relation 1 |
|---|---|---|---|---|---|---|---|
| Comparative Example 1 | 14 Å/s | 29 Å/s | 4849 Å | 30000 Å | 4800 Å | 2.07 | X |
| Example 1 | 20 Å/s | 65 Å/s | 4843 Å | 30000 Å | 4800 Å | 3.25 | ○ |
| Example 2 | 31 Å/s | 110 Å/s | 4783 Å | 30000 Å | 4800 Å | 3.39 | ○ |

Referring to Table 1, the silica layers manufactured by using the compositions for forming the silica layer according to Examples 1 and 2 satisfied Relation 1, but the silica layer manufactured by using the composition for forming the silica layer according to Comparative Example 1 did not satisfy Relation 1.

On the other hand, the scanning microscope cross sections of the formed silica layers are shown in FIGS. 2 to 4.

FIG. 2 is a scanning micrograph of a cross section of the silica layer according to Comparative Example 1, FIG. 3 is a scanning microscope photograph of a cross section of the silica layer according to Example 1, and FIG. 4 is a scanning microscope photograph of a cross section of the silica layer according to Example 2.

Referring to FIGS. 2 to 4, air gaps were formed inside the patterns of the thin films of Examples 1 and 2 which satisfied Relation 1, but the pattern of the thin film of Comparative Example 1 was relatively more filled with the silica layer than those of Examples 1 and 2.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A composition for forming a silica layer, the composition comprising:
   a silicon-containing polymer and a solvent,
   wherein the silicon-containing polymer comprises an organic-inorganic polysiloxazane;
   wherein the composition is configured such that, when the composition is coated on a pattern formed on a substrate to form a silica layer, the silica layer satisfies Relation 1:

$$\frac{b}{a} > \frac{(t/2)}{h}$$ [Relation 1]

wherein, in Relation 1,
a is an etch rate on an upper portion of the pattern,
b is an etch rate inside the pattern,
h is a layer thickness on the upper portion of the pattern, and
t is a length of the pattern; and
wherein the organic-inorganic polysiloxazane is obtained by reacting a hydrogenated polysiloxazane with hexamethyldisilazane (HMDS).

2. The composition of claim 1, wherein the silicon-containing polymer further comprises an organic-inorganic polysilazane.

3. The composition of claim 1, wherein in Relation 1, a and b are etch rates obtained by a wet etch method.

4. The composition of claim 1, wherein the composition is configured such that, when the composition is coated on the pattern formed on the substrate to form the silica layer, the silica layer satisfies Relation 2:

$$\frac{b}{a} > 3$$ [Relation 2]

wherein, in Relation 2,
a and b are the same as defined in Relation 1.

5. The composition of claim 2, wherein the organic-inorganic polysilazane comprises a moiety represented by Chemical Formula 1 and the organic-inorganic polysiloxazane comprises a moiety represented by Chemical Formula 2:

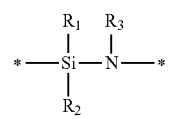

[Chemical Formula 1]

wherein, in Chemical Formula 1,
R1 to R3 are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and
"*" refers to a linking point,

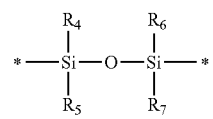

[Chemical Formula 2]

wherein, in Chemical Formula 2,
$R_4$ to $R_7$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and "*" refers to a linking point.

6. The composition of claim 1, wherein the silicon-containing polymer is included in an amount of 0.1 to 30 wt % based on a total amount of the composition for forming the silica layer.

7. A silica layer comprising a silica component obtained by curing the composition for forming the silica layer of claim 1.

8. An electronic device comprising the silica layer of claim 7.

9. A composition for forming a silica layer, the composition comprising:
a silicon-containing polymer and a solvent,
wherein the silicon-containing polymer comprises an organic-inorganic polysiloxazane;
wherein the organic-inorganic polysiloxazane is obtained by reacting a hydrogenated polysiloxazane with hexamethyldisilazane (HMDS); and
wherein the organic-inorganic polysiloxazane comprises a moiety represented by

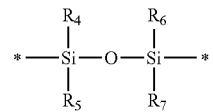

[Chemical Formula 2]

wherein, in Chemical Formula 2,
$R_4$ to $R_7$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and "*" refers to a linking point.

10. The composition of claim 9, wherein the silicon-containing polymer is included in an amount of 0.1 to 30 wt % based on a total amount of the composition for forming the silica layer.

11. A silica layer comprising a silica component obtained by curing the composition for forming the silica layer of claim 9.

12. An electronic device comprising the silica layer of claim 11.

* * * * *